United States Patent
Maekawa

Patent Number: 6,066,547
Date of Patent: *May 23, 2000

[54] THIN-FILM TRANSISTOR POLYCRYSTALLINE FILM FORMATION BY NICKEL INDUCED, RAPID THERMAL ANNEALING METHOD

[75] Inventor: Masashi Maekawa, Vancouver, Wash.

[73] Assignees: Sharp Laboratories of America, Inc., Camas, Wash.; Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/879,386

[22] Filed: Jun. 20, 1997

[51] Int. Cl.$^7$ .................................................. H01L 21/20

[52] U.S. Cl. ......................... 438/486; 438/149; 438/166; 438/487

[58] Field of Search ..................................... 438/155, 163, 438/FOR 155, 142, 149, 151, 162, 166, 308, 486, 487

[56] References Cited

U.S. PATENT DOCUMENTS

| | | | |
|---|---|---|---|
| 5,147,826 | 9/1992 | Liu et al. | 438/233 |
| 5,275,851 | 1/1994 | Fonash et al. | 427/578 |
| 5,481,121 | 1/1996 | Zhang et al. | |
| 5,529,937 | 6/1996 | Zhang et al. | 437/10 |
| 5,639,698 | 6/1997 | Yamazaki et al. | |
| 5,643,826 | 7/1997 | Ohtani et al. | |
| 5,773,329 | 6/1998 | Kuo | |

OTHER PUBLICATIONS

S. R. Wilsin, W. M. Paulson, R. B. Gregory, "Rapid Thermal Annealing for Future VLSI", Solid State Technology, p. 185, Jun. 1985.

Stanely Wolf and Richanrd N. Tauber, Silicon Processing for the VLSI Era, vol. 1, pp. 57–58, 1986.

S. M. Sze, VLSI Technology, second edition, pp. 355–362, 1988.

C. Hayzelden and J. L. Batstone "Silicide formation and silicide–mediated crystallization of nickel–implanted amorphous silicon thin films", J. Appl. Phys. 74 (12) p. 8279, Jun. 15, 1993.

Kawazu, Japanese Journal of Applied Physics:vol. 29 No. 12 Dec. 1990 pp.: 2698–2704 "Low–Temperature Crystallization of Hydrogenated Amorphos Silicon Induced by Nickel Silicide Formation".

Kawazu, Japanese journal of Applied Physics:vol. 29 No. 4 Apr. 1990 pp.: 729–738 "Intial Stage of the Interfacial Reaction between Nickel and Hydrogenated Amorphous Silicon".

Hayzelden, Journal of Applied Physics: 73 (12), Jun. 15, 1993 pp.: 8279–8289 "Silicide Formation and Silicide–Mediated Crystallization of Nickel Implanted Amorphous Silicon Thin Fils".

(List continued on next page.)

Primary Examiner—Charles Bowers
Assistant Examiner—Evan Pert
Attorney, Agent, or Firm—David C. Ripma; Matthew D. Rabdau

[57] ABSTRACT

A method for annealing amorphous silicon film to produce polycrystalline film suitable for thin-film transistors fabricated on glass substrates is provided. The method involves using nickel to help induce the crystallization. The method also uses a high temperature, for a short period of time, to anneal the amorphous silicon. A one-step annealing process implants nickel ions, having a dosage of approximately $1 \times 10^{15}$ ions/cm$^2$, into the silicon before annealing. A two-step annealing process is also provided in which a thin nickel film is put in close proximity to the amorphous silicon film. A first, low temperature, anneal converts a portion of the films to nickel silicide. A second, high temperature, anneal uses the silicide to induce the amorphous film to crystallize. A TFT polycrystalline film made by the above mentioned process of using nickel and, either a one, or two-step high temperature annealing to induce crystallization is also provided.

18 Claims, 8 Drawing Sheets

OTHER PUBLICATIONS

Kuo, The Electrochemical Society Proceedings; vol. 94–35 pp. 116–122 "Thin Film Transistor Technologies", Apr. 1995.

Liu, Applied Physics Letters 55 (7) Aug. 14, 1989 pp.: 660–662 "Selective area crystallization of amorphous silicon films by low–temperature rapid thermal annealing".

Cuane, Applied Surface Science 36 (Jan. 1989) pp.: 597–604 "Combined CW Laser and /Furnace annealing of Amorphous Si and Ge in Contact With Some Metals".

Article entitled, "Low Temperature Poly–Si Thin–Film Transistor Fabrication by Metal–Induced Lateral Crystallization" by Seok–Woon Lee and Seung–Ki Joo, printed in the IEEE Electron Device Letters, vol. 17, No. 4, Apr. 1996.

Article entitled, "AI Induced Crystallization of a–Si" by G. Radnoczi, A. Robertsson, H.T.G. Hentzell, S.F. Gong and M.–A Hasa, accepted for publ. Jan. 9, 1991 in the J. Appl. 69, pp. 6394–6399.

Article entitle, "Silicide formation and Silicide–mediated Crystallization of Nickel–Implanted Amorphous Silicon Thin Films" by C. Hayzelden and J. L. Batsone, accept for publication Feb. 26, 1993 J. Appl. Phys. 73 (12), Jun. 15, 1993, pp. 8279–8289.

Article entitled, "Pd Induced Lateral Crystallization of Amorphous Si Thin Films", by Seok–Woon Lee, Yoo–Chan Jeon and Seung–Ki Joo, accepted for publication Jan. 4, 1995, Appl. Phys. Lett. 66 (13), Mar. 27, 1995, pp. 1671–1673.

THIN-FILM TRANSISTOR POLYCRYSTALLINE FILM FORMATION BY NICKEL INDUCED, RAPID THERMAL ANNEALING METHOD

BACKGROUND AND SUMMARY OF THE INVENTION

This invention relates generally to thin-film transistor (TFT) processes and fabrication, and more particularly, to a TFT polycrystalline film, and method of using transition metals, such as nickel, to induce the crystallizing of an amorphous film.

The demand for smaller electronic consumer products with higher resolution displays, spurs continued research and development in the area of liquid crystal displays (LCDs). The size of LCDs can be decreased by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/Vs$. Carrier mobility is improved by using crystallized silicon. Single crystal silicon transistors, which are usually used in TFT driver circuits, have electron mobilities on the order of 500 to 700 $cm^2/Vs$. Polycrystalline silicon transistor performance is between the two extremes, having mobilities on the order of 10 to 400 $cm^2/Vs$. Thin-film transistors having mobilities greater than 100 $cm^2/Vs$ would probably be useful in replacing LCD periphery mounted driver circuitry. However, it has been difficult to produce polycrystalline TFTs with electron mobilities of even 40 to 50 $cm^2/Vs$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600° C. for substantial lengths of time. Even the fabrication of polycrystalline silicon transistors has been very difficult due to the necessity of using low temperature crystalline processes when glass is involved. Current polycrystalization processes typically require annealing times of approximately 24 hours, at 600° C., to produce TFTs having a mobility of approximately 30–50 $cm^2/Vs$. These processes are not especially cost effective due to the long process times, and the TFTs produces are not suitable for LCD driver circuits.

The direct deposition of amorphous silicon film is probably the cheapest method of fabricating TFTs. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources, are used. In a hot wire CVD system the production of activated hydrogen atoms leads to the decomposition of the source gases. However, TFTs made from direct deposition have poor performance characteristics, with mobilities on the order of 1 to 10 $cm^2/Vs$.

Solid phase crystallization (SPC) is a popular method of crystallizing silicon. In this process, amorphous silicon is exposed to heat approaching 600° C. for a period of at least several hours. Typically, large batches of LCD substrates are processed in a furnace having a resistive heater heat source. TFTs made from this crystallization process are more expensive than those made from direct deposition, but have mobilities on the order of 50 $cm^2/Vs$. A rapid thermal anneal (RTA) uses a higher temperature but for very short durations of time. Typically, the substrate is subjected to temperatures approaching 700 or 800° C. during the RTA, however, the annealing process occurs relatively quickly, in minutes or seconds. Glass substrates remain unharmed due to the short exposure time. Because the process is so rapid, it is economical to process the substrates serially. Single substrates can also be brought up to annealing temperatures faster than large batches of substrates. A tungsten-halogen, or Xe Arc, heat lamp is often used as the RTA heat source.

An excimer laser crystallization (ELC) process has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformities into the annealing process. Further, the wafers must be annealed serially, instead of in a furnace in batches. Although mobilities of over 100 $cm^2/Vs$ are obtainable, TFTs made by this method are significantly more expensive than those made by direct deposition or SPC.

Also under investigation is the use of metal, such as aluminum, indium tin oxide, and transition metals such as nickel, cobalt, and palladium to encourage the crystallization of silicon. Nickel seems especially promising, as the lattice constant of nickel disilicide is similar to silicon. In general, nickel has been used to reduce the annealing temperature typically required in a conventional solid phase crystallization (SPC) from approximately 600° C. to a temperature in the range between approximately 500 to 550° C., so that the LCD substrates are less susceptible to shrinkage. The use of nickel also significantly shortens the annealing process times. TFTs made through this process cost about the same as those made with the SPC method, however, the mobilities of metal-induced TFTs can approach 100 cm$^2$/Vs. Liu et al., U.S. Pat. No. 5,147,826, discloses the deposition of a nickel film on amorphous silicon so that the annealing temperature can be reduced to approximately 550 to 650° C. Fornash et al., U.S. Pat. No. 5,275,851 disclose a similar process. However, neither method produces polycrystalline silicon TFTs with very high electron mobility.

An improvement to the SPC or laser annealing process is presented in co-pending U.S. Pat. Ser. No. 08/812,580, filed Mar. 7, 1997, entitled "Polycrystalline Silicon from the Crystallization of Microcrystalline Silicon and Method for Same", invented by Tolis Voutsas, now U.S. Pat. No. 5,827,773, which is assigned to the same assignees as the instant application. This patent application discloses the use of amorphous film with embedded microcrystallites to produce polycrystalline silicon. The polycrystalline silicon has a more uniform distribution of crystal structures, and larger crystal grains. However, the invention does not address the subject of increasing the quality, and reducing the costs, of metal-induced crystallized film.

The process of heating amorphous silicon to form crystallized silicon is not entirely understood, and research on the subject continues. Variations in temperature, film thickness, the degree to which the amorphous matter melts, impurities in the film, and a range of other factors influence the annealing of amorphous silicon. Generally, large grains of crystallization, or crystallization able to support high carrier mobilities, occur in a polycrystalline film at a specific temperature near the melting point. Temperatures below this preferred temperature do not melt the amorphous silicon enough to form large grain areas, or to form uniformly crystallized film. Temperatures above the preferred temperature rapidly lead to bulk nucleation. The bulk nucleation of amorphous matter results in the spontaneous crystallization of an amorphous film into relatively small grain sizes so that the electron mobility is relatively poor.

It would be advantageous if a method were found of annealing amorphous silicon to form polycrystalline TFT transistors on glass substrates with electron mobilities exceeding 100 cm$^2$/Vs.

It would be advantageous if a method were found of improving the, low cost, metal-induced crystallization to form polycrystalline TFT transistors having electron mobilities exceeding 100 cm$^2$/Vs. Further, it would be advantageous if, simultaneously, an RTA process could be incorporated to reduce annealing process times, and so, further reduce annealing costs.

Accordingly, in forming thin-film transistors with high electron mobility, a method for crystallizing an amorphous film is provided, comprising the steps of:

a) depositing a layer of the amorphous film having a first thickness;

b) depositing a layer of transition metal film having a second thickness overlying, and in contact with, the amorphous film;

c) annealing the films deposited in steps a) and b) so that a portion of the amorphous film underlying the transition metal is consumed to form a transition metal semiconductor compound; and d) rapid thermal annealing (RTA) to convert, at least partially, the amorphous film into a polycrystalline film. The transition metal induces rapid crystallization of the amorphous film in a continuous, unidirectional, growth front.

When the amorphous film is silicon, and the transition metal nickel, the second thickness of nickel film is greater than 5 Å. A thin nickel thickness induces crystallization of transistor active regions with low leakage currents. Further steps are included, before step d), of:

e) preheating the amorphous film at a temperature in the range between 400 and 500° C.; and f) ramping the temperature up from the preheating temperature of step e) to the RTA temperature of step d) at a rate greater than 10° C. per second, whereby lower temperature, transition metal-assisted crystal growth occurs during the incubation time.

In forming a thin-film transistors with high electron mobility, a one-step annealing method for crystallizing an amorphous film is provided, comprising the steps of:

a) depositing a layer of the amorphous film having a first thickness;

b) introducing a transition metal to the amorphous film; and c) rapid thermal annealing (RTA) to convert, at least partially, the amorphous film into a polycrystalline film. When the amorphous film is silicon, and the transition metal is nickel, step b) includes introducing the transition metal as ions implanted at a first dosage in the range between $1\times10^{14}$ and $1\times10^{16}$ ions/cm$^2$.

Also provided is a thin-film transistor (TFT) comprising a transparent substrate and a TFT polycrystalline semiconductor film, overlying the transparent substrate, formed from depositing an amorphous film on the substrate, and rapid thermal annealing the amorphous film with a transition metal. The TFT is fabricated through both the one and two step annealing methods, described above.

DETAIL DESCRIPTION OF THE PREFERRED EMBODIMENT

Figure 1:
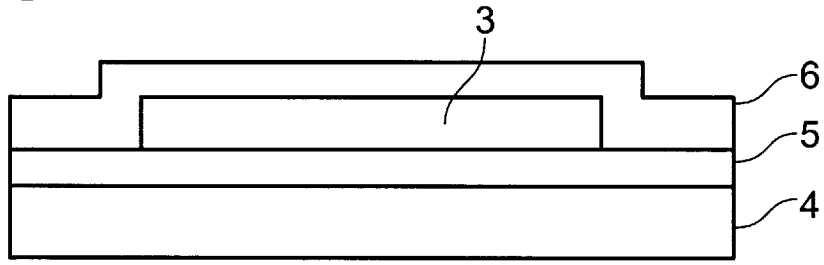
FIGS. 1 through 3 illustrate stages in the two step, nickel-induced, annealing method for forming a completed polycrystalline film with high electron mobility.
Figure 2:
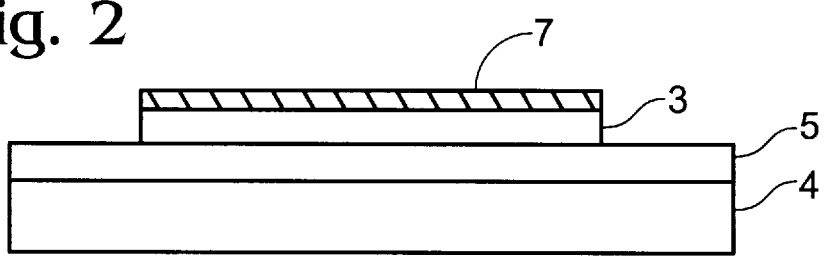
Figure 3:
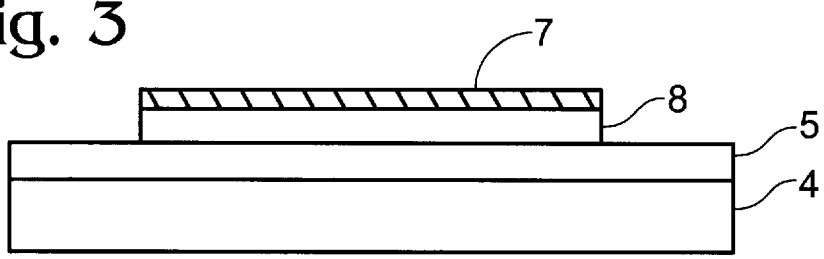

FIGS. 1 through 3 illustrate stages in the two step, nickel-induced, annealing method for forming a completed polycrystalline film with high electron mobility. The TFT polycrystalline semiconductor film is formed from rapid thermal annealing an amorphous film with a transition metal. FIG. 1 is a partial cross-sectional view depicting the deposition of an amorphous film, or amorphous layer, 3. Typically, amorphous layer 3 is deposited overlying a transparent substrate 4, with an intervening barrier layer 5. A transition metal film 6 is deposited overlying amorphous layer 3.

FIG. 2 is a partial cross-sectional view of amorphous film 3 of FIG. 1, after a first annealing step. A portion of amorphous film 3 underlying transition metal film 6 has been consumed to form a transition metal semiconductor compound 7. After the first annealing step, unreacted transition metal film 6 is removed.

FIG. 3 is a partial cross-sectional view of amorphous film 3 of FIG. 2 after a RTA to convert amorphous film 3 into a polycrystalline film 8. It is understood in the discussion, below, of the present invention, that the focus can be broadened to the fabrication of polycrystalline films, or narrowed to polycrystalline films used in TFTs fabricated on LCDs. Specifics of the two step annealing process outlined in FIGS. 1 through 3, will be discussed with regard to a TFT in FIGS. 4 through 11, below.

FIGS. 4 through 11 illustrate stages in a method of forming a completed thin-film transistor where nickel has been used to induce the formation of a polycrystalline film through a two-step annealing process. FIGS. 4 through 11 display a TFT polycrystalline semiconductor film formed in a two-step annealing process, a first step of annealing an amorphous film and a transition metal film to form a transition metal semiconductor compound, and a second, rapid thermal, annealing to crystallize the amorphous film. The inclusion of a transition metal in the annealing process encourages rapid crystallization along a unidirectional growth front.

Figure 4:
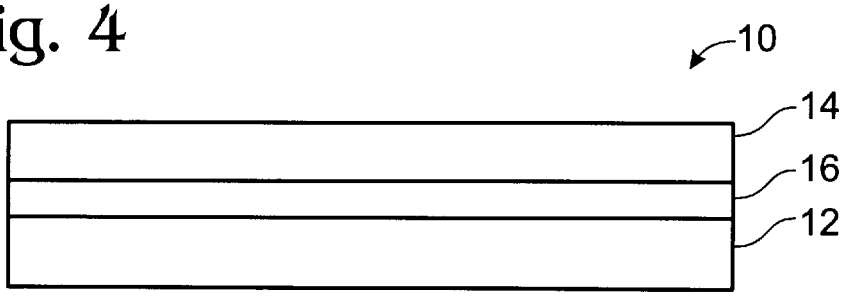
FIGS. 4 through 11 illustrate stages in a method of forming a completed thin-film transistor where nickel has been used to induce the formation of a polycrystalline film through a two step annealing process.

FIG. 4 is a partial cross-sectional view of a thin-film transistor 10 in fabrication. Thin-film transistor 10 is typically used as one of critical components in a liquid crystal display (not shown). TFT 10 comprises a transparent substrate 12. Transparent substrate 12 is selected from the group consisting of glass and quartz. An amorphous film, or amorphous layer, 14 is deposited over transparent substrate 12. Amorphous film 14 is selected from the group consisting of silicon, germanium, and silicon-germanium alloys. Amorphous film 14 is deposited by PECVD in many TFT fabrication processes. In some applications, a barrier layer 16 is deposited overlying transparent substrate 12. Barrier layer 16 is selected from the group consisting of silicon oxides, silicon nitrides, and combinations of silicon oxides and silicon nitrides. In some aspects of the invention, barrier layer 16 is made from the oxidation of TEOS and has a thickness of 4000 Å.

Figure 5:
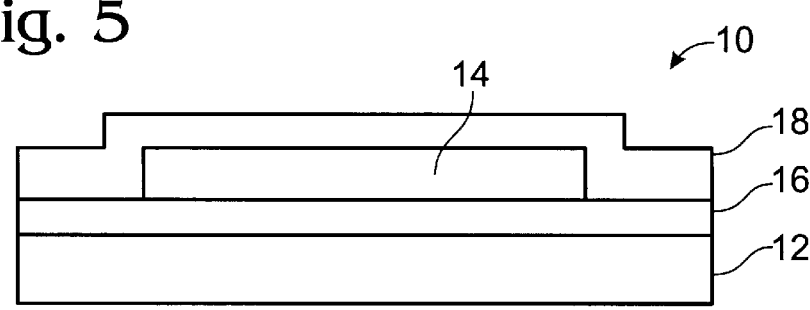

FIG. 5 is a partial cross-sectional view of TFT 10 after the deposition of a layer of oxide 18. Oxide layer 18 has a thickness of 1000 Å in some aspects of the invention. Prior to the deposition of oxide layer 18, amorphous layer 14 is etched into selected areas, or islands, by any conventional photolithographic process.

Figure 6:
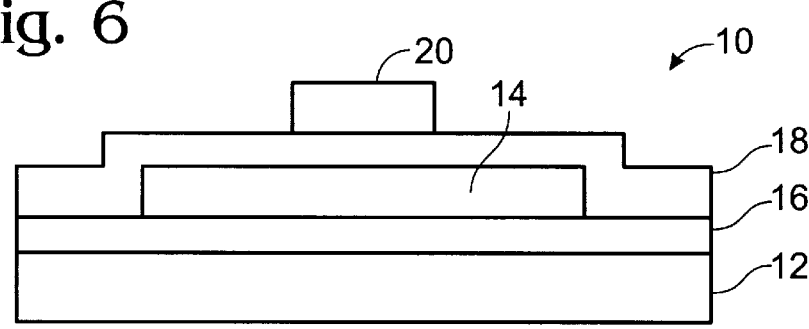

FIG. 6 is a partial cross-sectional view of TFT 10 after a semiconductor material film 20 is deposited overlying oxide layer 18 to form a gate. Semiconductor material film 20 is typically selected from the group consisting of polycrystalline silicon, refractory metals, and polycide. However, other conventional semiconductor materials are suitable.

Figure 7:
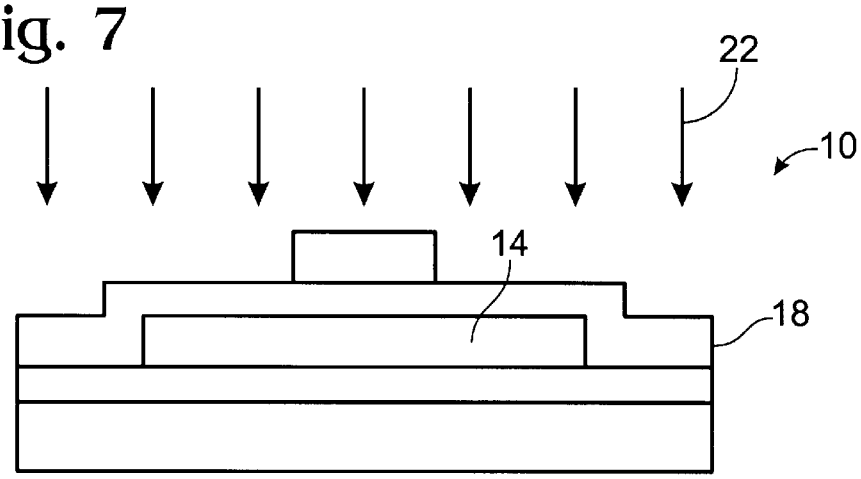

FIG. 7 is a partial cross-sectional view of TFT 10 as amorphous layer 14 is implanted with doping impurities to form source/drain regions. The doping impurities are represented by lines 22 being directed to TFT 10. Doping impurities 22 are selected from the group consisting of phosphorous, arsenic, and boron. As is well known in the art, these impurities are used to form n+ or p+ active regions for the source and drain. In some aspects of the invention, a separate RTA process step is used to activate dopant 22.

Figure 8:
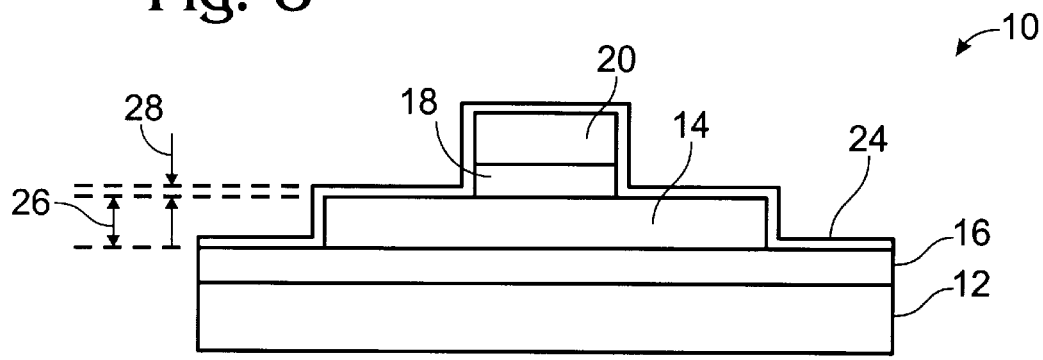

FIG. 8 is a partial cross-sectional view of TFT 10 following the deposition of a transition metal film 24 overlying, and in contact with, amorphous film 14. Transition metal film 24 is selected from the group consisting of nickel, cobalt, palladium, and platinum. Transition metal film 24 is deposited through sputtering techniques and e-beam evaporation. Prior to the deposition of transition metal film 24, oxide layer 18 is selectively removed.

Using gate 20 as a mask, oxide layer 18 is etched from TFT 10. Oxide layer 18, remaining under gate 20 is hereafter referred to as gate oxide layer 18. Amorphous film 14 has a first thickness represented by reference designator 26 and transition metal layer 24 has a second thickness represented by reference designator 28. The transition metal-induced crystallization, described below, results in transistor active regions with low leakage currents. In one aspect of the invention, transition metal film 24 second thickness 28 is greater than 5 Å. In a preferred embodiment, transition metal film 24 is nickel, and second thickness 28 is greater than 5 Å. Further, amorphous silicon film 14 is silicon has a first thickness of approximately 500 Å. The thin transistor active regions have high electron mobility and small leakage currents.

Figure 9:
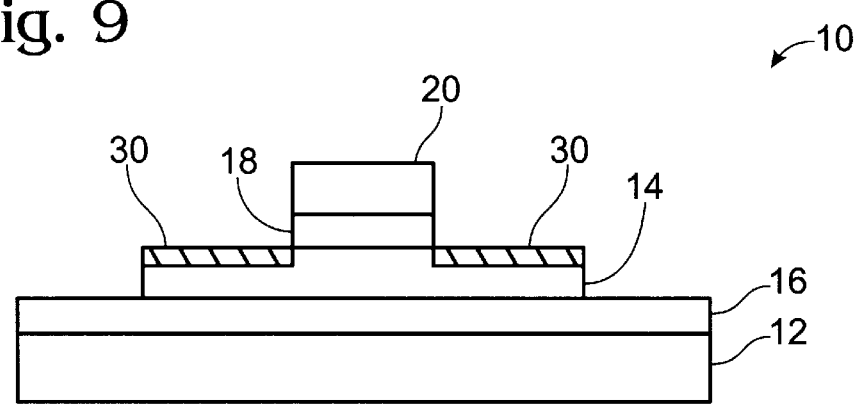

FIG. 9 is a partial cross-sectional view of TFT 10 after the first step of annealing in a two-step annealing process. Transition metal film 24 and amorphous film 14 have been annealed to form a transition metal semiconductor compound 30 before a second, rapid thermal, annealing step, shown below. Unreacted transition metal film 24 (FIG. 5) is etched off by a mixture of sulfuric acid and hydrogen peroxide sometimes called a piranha etch. This cleaning step removes substantially all nickel from TFT 10 except that which was annealed to form transition metal semiconductor compound 30. When amorphous film 14 is silicon, and transition metal film 24 is nickel, the first annealing step produces silicide as nickel semiconductor compound 30. Silicide is understood to include nickel mono-silicide, nickel disilicide, and a mixture of nickel mono-silicide and nickel disilicide. Likewise, when amorphous film 14 is germanium, then germanide, or nickel germanide, is formed. When amorphous film 14 is a silicon-germanium alloy, then nickel semiconductor compound 30 is germanosilicide, or nickel germanosilicide.

When amorphous film 14 is silicon and transition metal film 24 is nickel, the first annealing step occurs at a temperature in the range between 250 and 550° C. for a period of time less than 30 seconds. The short duration and low temperature minimize nickel contamination. That is, the penetration of nickel into neighboring dielectric material (not shown) is minimized. The inclusion of nickel in dielectric material degrades the electrical isolating function of the dielectric. In a preferred embodiment of the invention, the annealing occurs at a temperature in the range between 250 and 470° C. for less than 30 seconds. While not intending to be bound by theory, it is believed that annealing at temperatures between 250 and 470° C. induces the formation of nickel mono-silicide, while annealing at temperatures between 470 and 550° C. induces the formation of nickel disilicide. While both forms of silicide are useful to assist in crystallization, low temperature annealing is preferred to reduce the diffusion of nickel into neighboring oxide regions.

Figure 10:
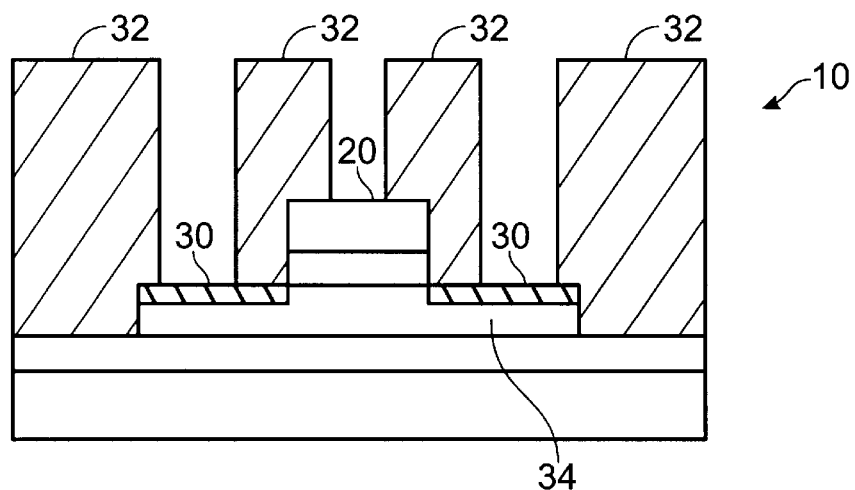

FIG. 10 is a partial cross-sectional view of TFT 10 following a second step of annealing, the rapid thermal anneal. An inter-metal insulator layer, or interlevel dielectric, 32 is deposited on TFT 10. Contact holes are defined through interlevel dielectric 32 to access transition metal semiconductor compound 30 overlying the source and drain areas, and to access gate 20. In the preferred embodiment, amorphous film 14 is silicon, transition metal film 24 is nickel, and the second, rapid thermal, annealing step occurs at an average temperature in the range between 650 and 800° C., and a time in the range between 1 nanosecond (ns) and 1,000 seconds. The length of the annealing time depends on temperature, film thicknesses, and film materials. During the step of rapid thermal annealing, amorphous silicon layer 14 is converted into a polycrystalline layer 34. The rapid annealing process minimizes the number of nickel silicide enclaves in the polycrystalline film which degrade transistor leakage current.

It is important for the crystallization process that the rapid thermal annealing temperature be reached quickly. To achieve this goal, TFT 10 is preheated before the second annealing step. Then, the temperature is ramped-up very quickly, until the rapid thermal annealing temperature is reached. This rapid ramp-up process reduces the transition metal-assisted crystal growth that occurs during the ramp-up time, when temperatures are lower, which produces a poor quality crystal. The rapid temperature ramp-up also acts to avoid spontaneous nucleation as amorphous film 14 crystallizes. Spontaneous nucleation produces a lessor quality crystallization with electron mobility characteristics typically less than 30 cm$^2$/Vs.

In one aspect of the invention, transparent substrate 12 is glass, and nickel semiconductor compound 30, formed during the first annealing step, is nickel suicide. Amorphous silicon film 14 and nickel silicide 30 are preheated before the second, rapid thermal, annealing step, at a temperature in the range between 400 and 500° C. Once TFT 10 has been preheated, the temperature is ramped-up from the preheat temperature to the second, rapid thermal, annealing temperature at a temperature rate greater than 10° C. per second. In a preferred embodiment, the ramp-up temperature rate exceeds 50° C. Because of the quick ramp-up temperatures, lower temperature transition metal-assisted crystal growth, which is of poorer quality, occurs during the incubation period. In addition, the quick ramp-up time minimizes spontaneous nucleation in the pure amorphous film region. In the preferred embodiment, the rapid thermal annealing includes using a tungsten-halogen lamp, Xe Arc lamp, and excimer laser as the annealing heat source. It is understood that the various preheat, ramp-up, and annealing temperatures are defined as the temperature experienced by amorphous film 14.

Figure 11:
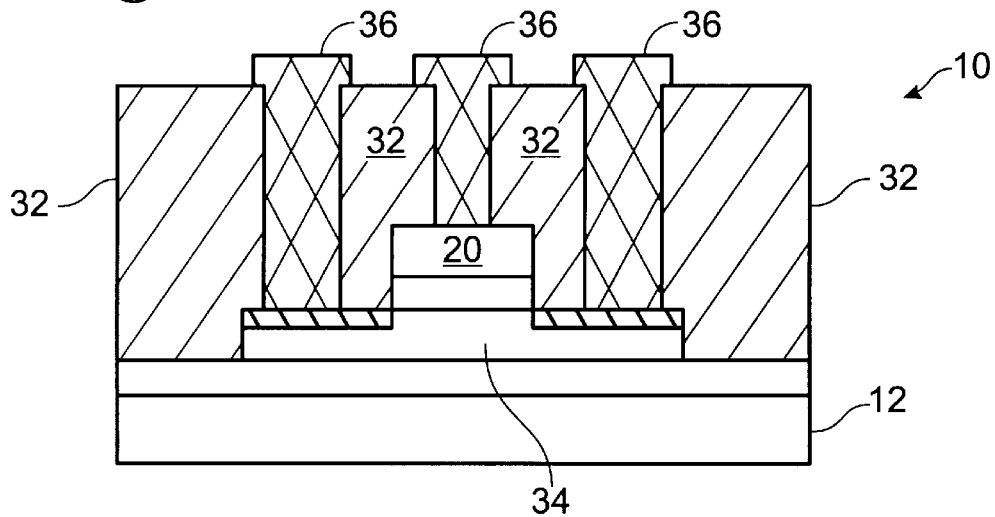

FIG. 11 is a partial cross-sectional view of completed TFT 10. A TFT polycrystalline semiconductor film 34 overlies transparent substrate 12 formed from depositing amorphous film 14 on substrate 12, and rapid thermal annealing amorphous film 14 with transition metal film 24, as shown in FIGS. 4 through 10. FIG. 11 also shows metal level 36. Metal 36 has filled the vias through interlevel dielectric 32 to access the source, drain, and gate regions of TFT 10. Metal level 36 has been patterned in preparation for forming contacts to other sections of TFT 10 or to other subsequently deposited metal levels or semiconductor regions (not shown). Alternately, a TFT is fabricated with amorphous film 14 deposited overlying, and in contact with, transition metal film 24. Films 14 and 24 are then annealed similarly to the method described above. Further, a bottom gate TFT, which is essentially the reverse of the fabrication process described above, is manufactured using the annealing method of the present invention.

Figure 12:
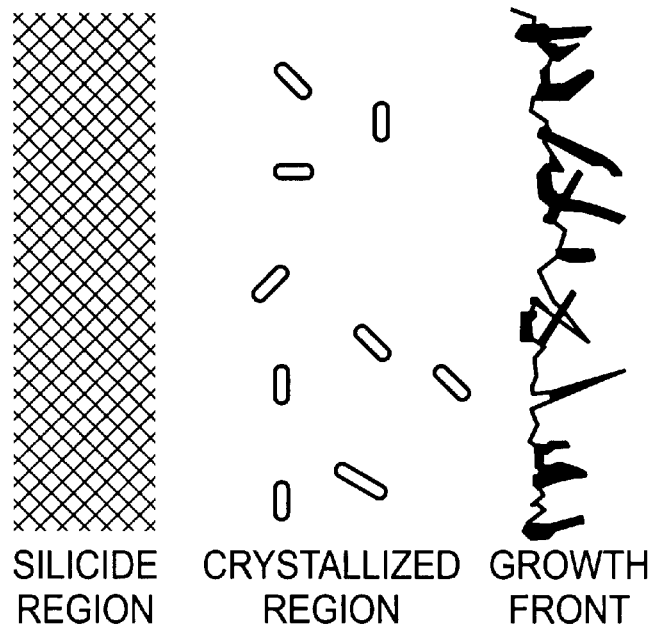
FIG. 12 illustrates the irregular growth front occurring from metal-induced crystallization at low temperatures (prior art).

FIG. 12 illustrates the irregular growth front occurring from metal-induced crystallization at low temperatures (prior art). At an annealing temperature of 500° C., for example, the metal induced crystallization exhibits an anisotropic behavior. The anisotropic nature of the growth is enhanced at lower temperatures. The crystal growth takes on the characteristics of fibers having a <111> orientation with a width of approximately 100 Å. Lower temperatures encourage differential growth in the <111> orientation, as compared to the other crystal orientations. As a result, an irregular shaped, complex, growth front develops. Nickel diffuses through the amorphous film on the edge of the growth front inducing further crystallization. The irregular growth front increases the probability that nickel silicide enclaves will become trapped in the crystallized film. The TFT fabricated from a crystallized film having nickel silicide enclaves exhibits high leakage currents, as nickel silicide is a conductive material. Further, the irregular growth front also increases the probability that amorphous enclaves will be trapped behind the growth front as the amorphous film is crystallized. Amorphous enclaves degrade TFT performance, reducing electron mobility.

Figure 13:
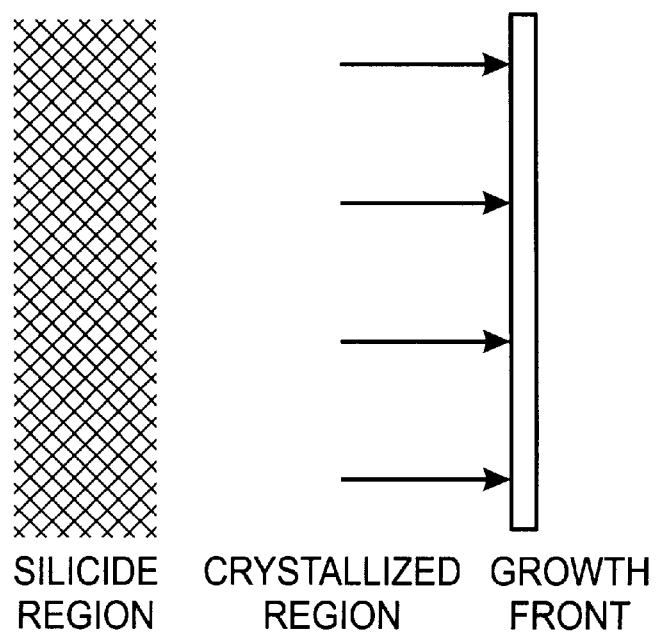
FIG. 13 illustrates the unidirectional growth front emerging from the nickel silicide layer into silicon during the rapid thermal annealing process.

FIG. 13 illustrates the unidirectional growth front emerging from the nickel silicide layer into silicon during the rapid thermal annealing process. As in FIG. 12 above, nickel diffuses through the amorphous film on the edge of the growth front, inducing crystallization. However, the growth front depicted in FIG. 13 is continuous, or unidirectional. The unidirectional growth front is less likely to trap enclaves of silicide or amorphous matter as it diffuses through the amorphous film. Because the crystallization along the growth front is less anisotropic at higher annealing temperatures, there are a fewer number of fibers protruding from the lateral growth front. The more random crystallographic orientation results in a more uniform lateral growth velocity. A TFT fabricated from such a film will have high electron mobility as well as low leakage current characteristics.

The upper limit of the rapid thermal annealing temperature is selected so as to not induce nucleation of the amorphous film before the required length of lateral growth occurs. Generally, spontaneous nucleation of amorphous silicon film occurs in less than a minute when the rapid thermal annealing temperature exceeds approximately 800° C. The exact timing and temperature needed for the occurrence of spontaneous nucleation is dependent upon the characteristics of the specific amorphous film.

Figure 14:
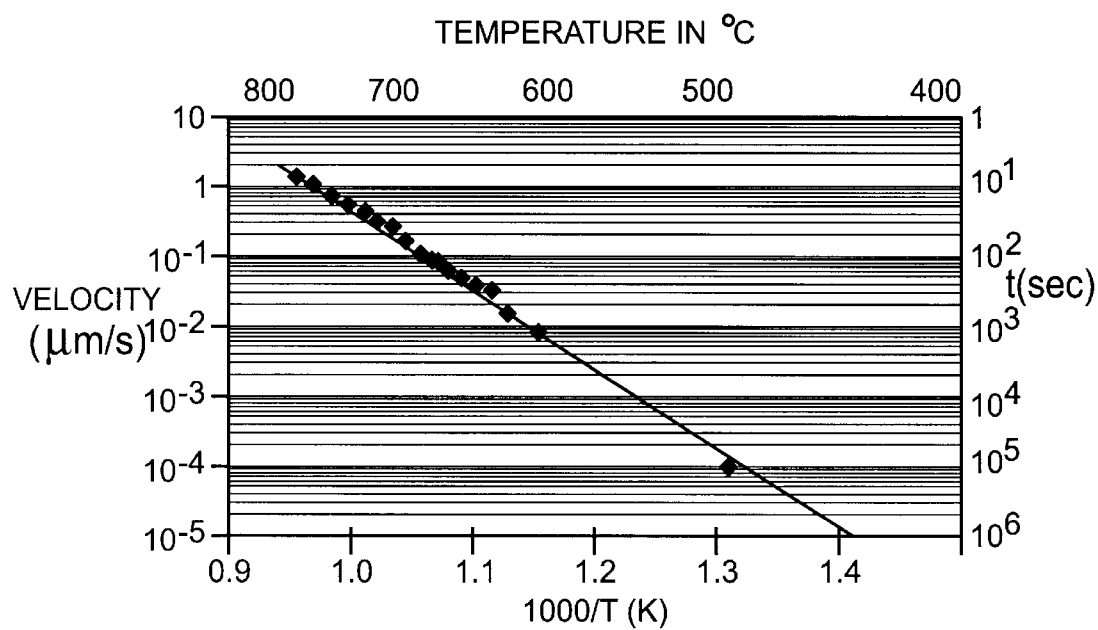
FIG. 14 illustrates the lateral growth velocity of nickel-induced crystallization against the variable of temperature.

FIG. 14 illustrates the lateral growth velocity of nickel-induced crystallization with the variable of temperature. The growth velocity v is given by the following formula:

$$v = v_o \exp(-E_a/kT)$$

where vo is the frequency factor in cm$^2$/s, $E_a$ is the activation energy in eV, T is temperature in K, and k is the Boltzman constant in eV/K. While not intending to be bound by theory, the above equation seems to explain the nature of nickel-assisted crystallization in amorphous silicon. The activation energy used in the lateral growth formula is 2.4 eV, the same as convention solid phase crystallization of amorphous silicon film on single crystal silicon substrate. This uniformity of activation energy suggests that the same cutting and rearrangement in Si—Si bonding exists in both processes. The frequency factor, $v_o = 9.0 \times 10^9$ cm$^2$/s, is about 24 times that of conventional SPC due to the existence of the almost matching lattice structure of nickel disilicide, which acts as a matrix for silicon crystal. According to FIG. 14, the growth velocity at 750° C. is approximately 773 times faster than the velocity at 550° C. Therefore, the annealing time of the present method is almost 1000 times less than prior art, low temperature, annealing methods.

FIG. 14 provides the lateral growth velocities for specific temperatures. Using this graph, the time needed to produce a required lateral growth length is calculated. For example, a transistor channel length of 8 microns is crystallized in approximately 8 seconds of annealing time, at a temperature of approximately 750° C. That is, the velocity of 1 micron per second occurs at 750° C. Because of the short annealing time, glass plates, such as a Corning 1737 substrate, can withstand the higher temperature without any deformation. Further, the short annealing times ensure a greater productivity than annealing at lower temperatures in a conventional furnace. The higher temperature annealing method of the present invention produces a better quality polycrystalline film in a short amount of time, and contradicts the current path of investigation in the field. The time needed to crystallize a specific source/drain region is also dependent on the geometries and positioning of the silicide and amorphous films.

Figure 15:
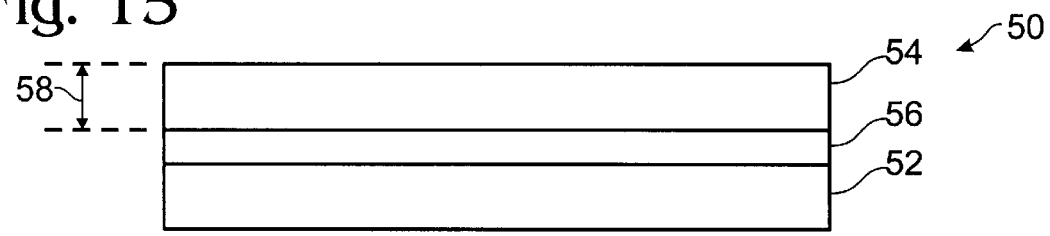
FIGS. 15 through 18 illustrate stages in a single, nickel-induced, rapid thermal annealing step for forming a completed polycrystalline film with high electron mobility.

FIGS. 15 through 18 illustrate stages in a single, nickel-induced, rapid thermal annealing step for forming a completed TFT polycrystalline semiconductor film with high electron mobility. The polycrystalline film is formed by rapid thermal annealing an amorphous film with a transition metal. As in FIGS. 1 through 11, the present invention is, when broadly focused, describes the formation of a polycrystalline film. However, since the polycrystalline film is typically used in TFT fabrication, the present invention is alternately described in the context of a polycrystalline TFT film. FIG. 15 depicts a thin-film transistor 50 having a transparent substrate 52 selected from glass and quartz. Overlying transparent substrate 52 is an amorphous film, or amorphous layer, 54. A barrier layer 56 separates amorphous film 54 from transparent substrate 52. Barrier layer 56 is selected from the group of materials consisting of silicon oxide, silicon nitride, and combinations of silicon oxide and silicon nitride. Amorphous film 54 has a first thickness 58.

Figure 16:
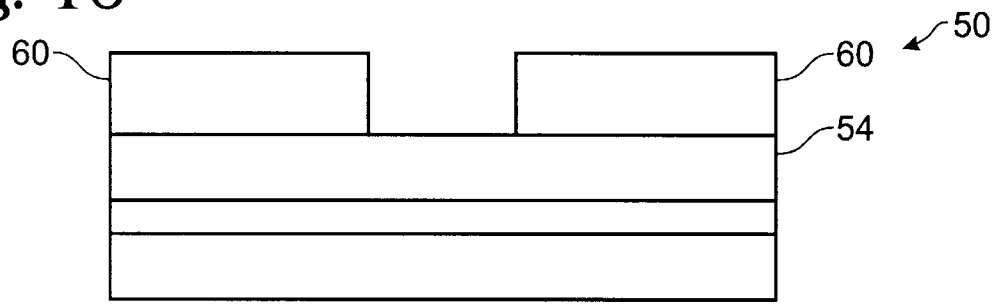

FIG. 16 is a partial cross-sectional view of TFT 50 following the deposition of dielectric interlevel 60. Interlevel 60 is etched to expose a selected area of amorphous film 54. That is, dielectric interlevel 60 is deposited overlying selected areas of amorphous film 54.

Figure 17:
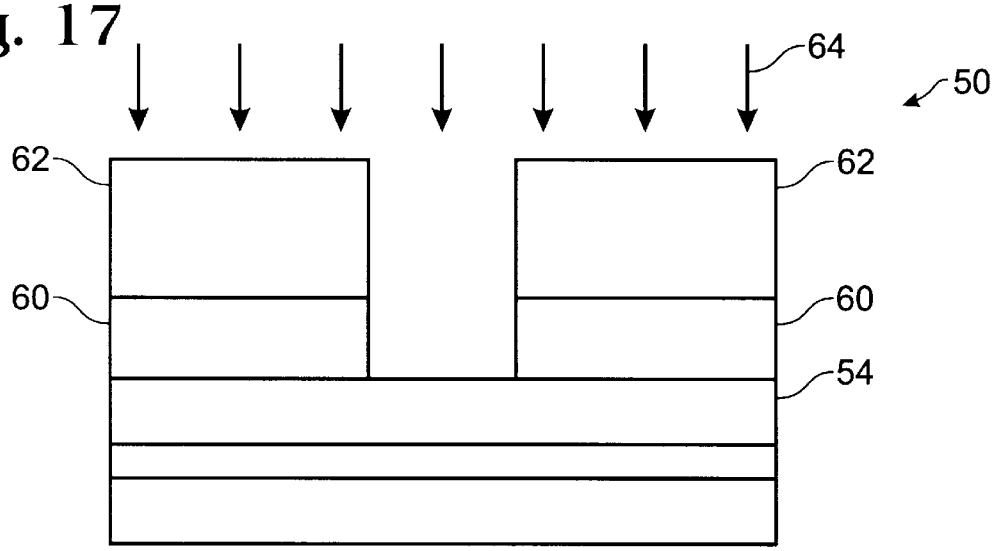

FIG. 17 is a partial cross-sectional view of TFT 50 after the deposition of a layer of photoresist 62 overlying selected areas of amorphous film 54. Photoresist 62 has been patterned to generally coincide with the pattern of dielectric interlevel 60. In this manner, a selected area of amorphous film 54 is exposed. A selected area of amorphous film 54 left exposed by vias, or openings, through dielectric interlevel 60 and photoresist 62. Transition metal is introduced to amorphous film 54. Transition metal introduction is selected from the group consisting of electroless plating, selective vapor deposition, and ion implantation at a first dosage. Selective vapor deposition involves the formation of metal organic compounds including a transition metal, and using a material such as an oxide to cover areas where transition metal is not desired. Preferably, transition metal is implanted into amorphous film 54 as ions. The transition metal ions are represented by reference designator 64, shown as arrows directed towards TFT 50. Generally, transition metal ions 64 are distributed through amorphous film 54 with the highest concentration of ions in the center of amorphous film 54, in the area of amorphous film 54 underlying the gap in photoresist 62. Although ions 64 follow a gaussian distribution pattern from amorphous film 54 center region, the standard deviation is large enough to make the ion distribution pattern substantially uniform.

Amorphous film 54 is selected from the group consisting of silicon, germanium, and silicon germanium alloys. In a preferred embodiment, amorphous film 54 is silicon, transition metal 64 is nickel, and the first dosage of nickel ions is in the range between $1\times10^{14}$ and $1\times10^{16}$ ions/cm$^2$. In one aspect of the invention, amorphous silicon layer 54 has a first thickness 58 of 500 Å and the first dosage is $1\times10^{14}$ ions/cm$^2$.

Figure 18:
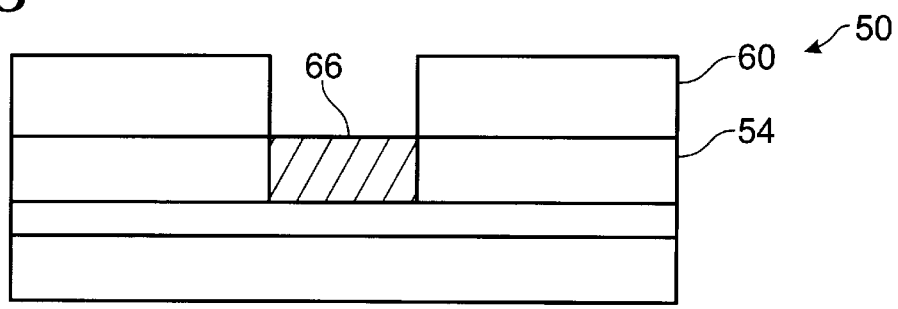

FIG. 18 is a partial cross-sectional view of TFT 50 following a rapid thermal annealing. Photoresist 62 has been stripped away from TFT 50. The RTA process converts, at least partially, amorphous film 54 into a polycrystalline film 66. The nickel induces rapid crystallization of amorphous film 54 in a continuous, unidirectional, growth front. The rapid thermal annealing occurs at an average temperature in the range between 650° to 800° C., and a time in the range between 1 ns and 1,000 seconds. The annealing heat source is selected from the group consisting of a tungsten-halogen lamp, Xe Arc lamp, and excimer laser.

In one aspect of the invention, transparent substrate 52 is glass, and amorphous silicon film 54, implanted with nickel ions 64, is preheated before the rapid thermal annealing step to a temperature in the range between 400 and 500° C. After preheating, the temperature is ramped-up from the preheat temperature to the rapid thermal annealing temperature at a rate greater than 10° C. per second. Preferably, the ramp-up temperature rate exceeds 50° C. per second. FIGS. 15 through 18 are a general depiction of a one-step rapid thermal annealing process of the present invention for crystallizing an amorphous film 54. The one-step annealing process depicted in FIGS. 15 through 18 is applicable to the formation of polycrystalline source/drain regions of a completed TFT transistor. The more specific depiction of steps in fabrication of a completed TFT, illustrated in FIGS. 4 through 11 with regard to the two-step annealing process, has been omitted in describing the one step method for the purposes of brevity.

Figure 19:
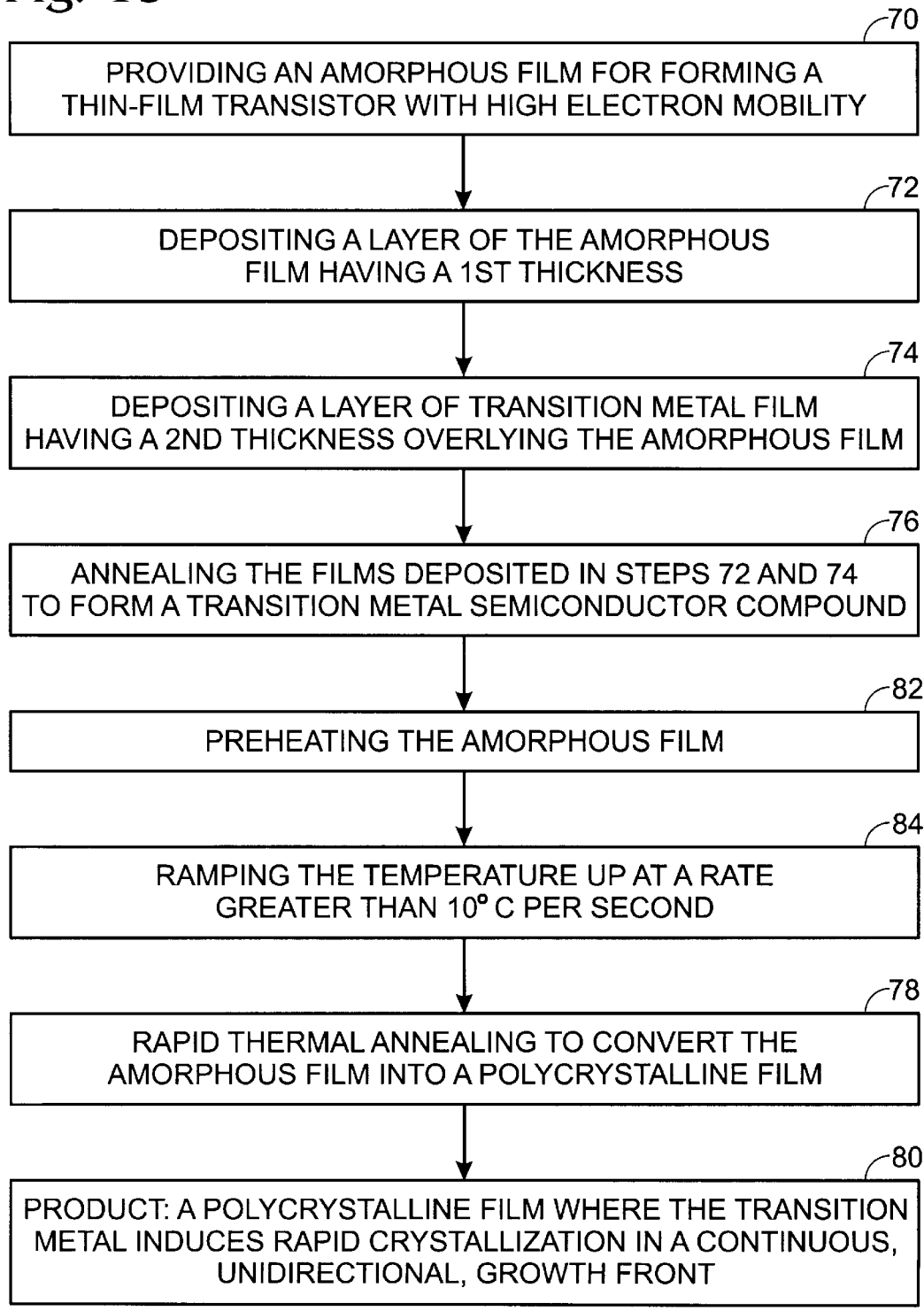
FIG. 19 is a flow chart illustrating steps in a two-step annealing method of crystallizing an amorphous film in the formation of a thin-film transistor with high electron mobility.

FIG. 19 is a flow chart illustrating a two-step annealing method of crystallizing an amorphous film in the formation of a thin-film transistor with high electron mobility. Step 70 provides an amorphous film for forming the thin-film transistor. Step 72 deposits a layer of the amorphous film having a first thickness. Step 74 deposits a layer of transition metal film having a second thickness overlying, and in contact with, the amorphous film. Step 76 anneals the films deposited in Step 72 and 74 so that a portion of the amorphous film underlining the transition metal is consumed to form a transition metal semiconductor compound. Step 78 rapid thermal anneals to convert, at least partially, the amorphous film into a polycrystalline film. Step 80 is a product: a polycrystalline film where the transition metal induces rapid crystallization of the amorphous film and a continuous, unidirectional, growth front.

The amorphous film is selected from the group consisting of silicon, germanium, and silicon germanium alloys. The transition metal film is selected from the group consisting of nickel, cobalt, palladium, and platinum. In one aspect of the invention, the amorphous film is silicon, the transition metal film is nickel, and the second thickness of nickel film is greater than 5 Å. In one preferred embodiment of the invention, the amorphous silicon film has a first thickness of approximately 500Å. In another aspect of the invention, step 76 includes annealing at a temperature in the range between 250 and 550° C. for a period of time less than 30 seconds. Preferably, the annealing is at a temperature in the range between 250 and 470° C.

Step 78 includes rapid thermal annealing at an average temperature in the range between 650 and 800° C., and a time in the range between 1 ns and 1,000 seconds. In this manner, a tungsten-halogen lamp, Xe Arc lamp, and excimer laser are used in the annealing process of Step 78. The method of the present invention is suitable for use with the low cost lamp heaters, as well as the more expensive laser technology. Step 78 also includes the use of pulsing or fluctuating heat sources that have high and low temperatures outside the range specified above, but having average temperatures between 650 and 800° C.

Typically, the method includes an additional step of depositing an amorphous film over a transparent substrate, with the transparent substrate being selected in the group consisting of glass and quartz. The thin-film transistor formed in such a process is suitable for use in a liquid crystal display. The method then includes an additional step, before step 72, of depositing a barrier layer overlying the transparent substrate. The barrier layer is selected from the group of materials consisting of silicon oxide, silicon nitride, and combinations of silicon oxide and silicon nitride.

FIG. 19 also depicts Step 82 which preheats the amorphous film. In one aspect of the invention the transparent substrate is glass, the amorphous film is silicon, and the transition metal is nickel. Then, the silicon film is preheated at a temperature in the range between 400 and 500° C. Step 84 ramps the temperature up from the preheating temperature of step 82 to the RTA temperature of step 78 at a rate greater than 10 degrees C. per second, preferably, at a temperature rate exceeding 50° C. per second.

As shown in FIG. 5, the method also includes the step of etching selected areas of the amorphous film deposited in step 72, and depositing an oxide film overlying the surface of the amorphous film not etched away to form a gate oxide layer. Further, the method includes a step of depositing a semiconductor material film overlying the surface of the gate oxide layer to form a gate. The semiconductor material is selected from group consisting of polycrystalline silicon, refractory metals such as Mo and Ta, and polycide. As shown in FIG. 7, the method includes the further step of implanting doping impurities in the amorphous film to form source/drain regions.

Figure 20:
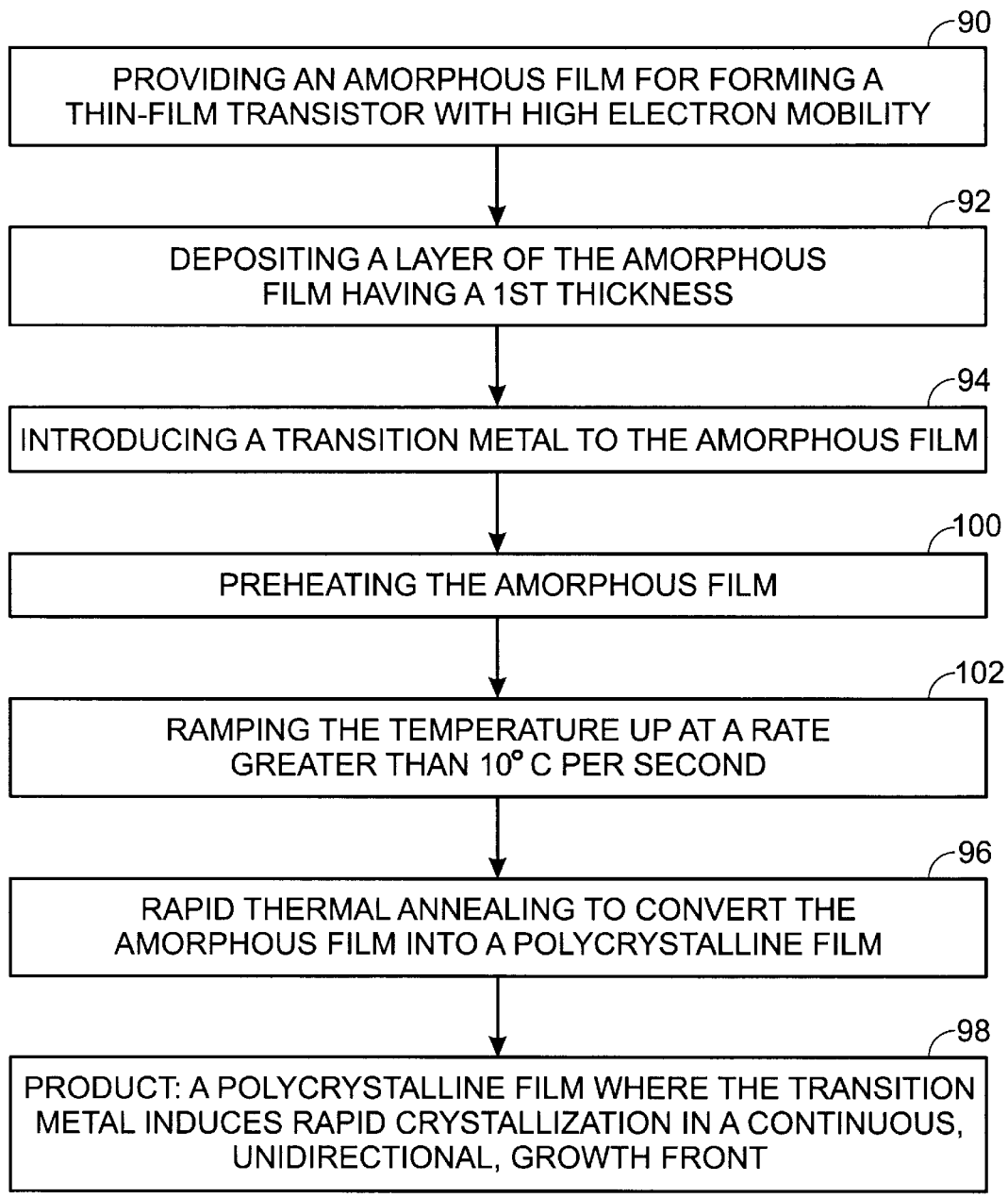
FIG. 20 is a flow chart illustrating steps in a one-step annealing method for crystallizing an amorphous film to form a thin-film transistor with high electron mobility.

FIG. 20 is a flow chart illustrating steps in a one-step annealing method for crystallizing an amorphous film to form a thin-film transistor with high electron mobility. Step 90 provides an amorphous film for forming the thin-film transistor. Typically, amorphous films are silicon, germanium, and silicon-germanium alloys. Step 92 deposits a layer of amorphous film having a first thickness. Step 94 introduces a transition metal to the amorphous film. The transition metal introduction is selected from the group consisting of electroless plating, selective vapor deposition, and ion implantation at a first dosage. The transition metal is selected from the group consisting of nickel, cobalt, palladium, and platinum. Step 96 rapid thermal anneals to convert, at least partially, the amorphous film into a polycrystalline film. Step 98 is a product: a polycrystalline film where the transition metal induces rapid crystallization of the amorphous film in a continuous, unidirectional, growth front.

In one aspect of the invention, a transparent substrate is provided, with the transparent substrate being selected from the group consisting of glass and quartz. Then, step 92 includes depositing the amorphous film over the transparent substrate, whereby the thin-film transistor is suitable for use in a liquid crystal display. In one aspect of the invention the transparent substrate is glass, the amorphous film is silicon, and the transition metal is nickel. Further steps, before step 96, are then included. Step 100 preheats the amorphous silicon film at a temperature in the range between 400 and 500° C. Step 102 ramps the temperature up from the preheating temperature of Step 100 to the RTA temperature of Step 96 at a rate greater than 10 degrees C. per second, and, preferably, at a temperature rate exceeding 50 degrees C. per second.

In one aspect of the invention, the amorphous film is silicon, the transition metal is nickel, and the first dosage of nickel ions in step 94 is in the range between $1 \times 10^{14}$ and $1 \times 10^{16}$ ions/cm$^2$. In one preferred aspect of the invention, step 92 includes depositing an amorphous silicon film having a first thickness of approximately 500 Å, and step 94 includes a first dosage of $1 \times 10^{14}$ ions/cm$^2$.

Step 96 includes rapid thermal annealing at an average temperature in the range between 650 and 800° C., and a time in the range between 1 ns and 1,000 seconds. Step 96 includes annealing with a tungsten-halogen lamp, Xe Arc lamp, and excimer laser. In one aspect of the invention, an additional step is added, before step 92, of depositing a barrier layer overlying the transparent substrate, and in which the barrier layer is selected from the group of materials consisting of silicon oxide, silicon nitride, and combinations of silicon oxide and silicon nitride.

The method depicted in FIG. 20 roughly corresponds to FIGS. 15 through 18. As in corresponding FIG. 16, a further step is included to deposit a dielectric interlevel overlying selected areas of the amorphous film deposited in step 92. As in FIG. 17, a step is included of depositing a layer of photoresist overlying the dielectric interlevel. The photoresist level protects dielectric interlevel from nickel contamination during the nickel implantation in Step 94. The general method of forming a polycrystalline film is also applicable to the formation of TFT source/drain regions.

Prior art, metal-induced, crystallization methods have had the purpose of reducing the crystallization temperatures. The present invention reduces the entire thermal budget. The higher temperatures of the present invention significantly reduce the annealing time, and the thermal stress experienced by the glass substrate of an LCD. Further, the crystallization achieved by the present method is superior to previously known TFT polycrystalline film methods. Finally, the cost of the equipment needed to perform the rapid thermal annealing of the present invention is approximately one third the cost of laser annealing equipment. Variations in process steps and IC structures derived from the present invention, as well as other embodiments of the invention, will occur to those skilled in the art.

What is claimed is:

1. In forming thin-film transistors with high electron mobility, a method for crystallizing an amorphous film on a transparent substrate comprising the steps of:
   a) depositing a layer of the amorphous film having a first thickness on the transparent substrate;
   b) depositing a layer of transition metal film having a second thickness overlying, and in contact with, the amorphous film;
   c) annealing the films deposited in steps a) and b) for a period of time less than approximately 30 seconds so that a portion of the amorphous film underlying the transition metal is consumed to form a transition metal semiconductor compound; and d) in a single heating step at a temperature in the range between 700 and 800 degrees C., rapid thermal annealing to convert, at least partially, the amorphous film into a polycrystalline film, whereby the transition metal induces rapid crystallization of the amorphous film in a continuous, unidirectional, growth front.

2. A method as in claim 1 in which the amorphous film is selected from the group consisting of silicon, germanium, and silicon-germanium alloys.

3. A method as in claim 2 in which the transition metal is selected from the group consisting of nickel, cobalt, palladium, and platinum.

4. A method as in claim 3 wherein the amorphous film is silicon, and in which the second thickness of transition metal film is greater than 5 Å, whereby the thin transition metal thickness induces crystallization of transistor active regions with low leakage currents.

5. A method as in claim 4 wherein the amorphous film is silicon, in which step a) includes depositing an amorphous silicon film having a first thickness of approximately 500 Å, whereby the thin transistor active regions have high electron mobility and small leakage currents.

6. A method as in claim 4 wherein the transition metal is nickel, and in which step c) includes annealing at a temperature in the range between 250 and 550° C., whereby the low temperature minimizes nickel contamination.

7. A method as in claim 6 in which step c) includes annealing at a temperature in the range between 250° and 470° C.

8. A method as in claim 6 in which step d) includes rapid thermal annealing at a time in the range between 1 ns and 1000 seconds.

9. A method as in claim 3 wherein the transparent substrate is selected from the group consisting of glass and quartz.

10. A method as in claim 9 wherein the transparent substrate is glass, the amorphous film is silicon, and the transition metal is nickel, and including a further step, before step d), of:
   e) preheating the amorphous film at a temperature in the range between 400 and 500° C.; and
   f) ramping the temperature up from the preheating temperature of step e) to the RTA temperature of step d) at a rate greater than 10° C. per second, whereby minimal crystal growth occurs during the incubation time.

11. A method as in claim 10 in which step f) includes a ramp-up temperature rate exceeding 50° C. per second.

12. A method as in claim 10 wherein a barrier layer is provided, selected from the group consisting of silicon oxide, silicon nitride, and combinations of silicon oxide and silicon nitride, and including the additional step, before step a), of:

h) depositing the barrier layer overlying the transparent substrate.

13. A method as in claim 1 including the additional steps, following step a), of:
   i) etching selected areas of the amorphous film deposited in step a); and
   j) depositing an oxide film overlying the surface of the amorphous film not etched away in step i) to form a gate oxide layer.

14. A method as in claim 13 wherein a semiconductor material is provided, selected from the group consisting of polycrystalline silicon, refractory metals, and polycide, and including the additional step, following step j), of:
   k) depositing the semiconductor material film overlying the surface of the gate oxide layer to form a gate.

15. A method as in claim 14 including the step, following step k), of:
   l) implanting doping impurities into the amorphous film to form source/drain regions, wherein the doping impurities are selected from the group consisting of phosphorous, arsenic, and boron.

16. A method as in claim 1 in which step d) includes annealing with a tungsten-halogen lamp, Xe Arc lamp, and excimer laser heat source.

17. In forming thin-film transistors with high electron mobility, a method for crystallizing an amorphous film on a transparent substrate comprising the steps of:
   a) depositing a layer of the amorphous film having a first thickness on the transparent substrate;
   b) depositing a layer of transition metal film having a second thickness overlying, and in contact with, the amorphous film;
   c) annealing the films deposited in steps a) and b) for a period of time less than approximately 30 seconds so that a portion of the amorphous film underlying the transition metal is consumed to form a transition metal semiconductor compound; and
   d) rapid thermal annealing (RTA) at an average temperature in the range between 700 and 800 degrees C. to convert, at least partially, the amorphous film into a polycrystalline film, whereby the transition metal induces rapid crystallization of the amorphous film in a continuous, unidirectional, growth front.

18. A method as in claim 17 in which Step d) includes a single step of heating at an average temperature of 750 degrees C. and annealing time of 8 seconds.

* * * * *